(12) United States Patent
McTighe, Jr. et al.

(10) Patent No.: US 10,424,911 B2
(45) Date of Patent: Sep. 24, 2019

(54) DEVICE FOR DETECTING AND ERADICATING A LEAKAGE AND/OR STRAY CURRENT IN/FROM A WATER BODY

(71) Applicant: SafeWater Systems, Inc., Punta Gorda, FL (US)

(72) Inventors: Donald A. McTighe, Jr., Punta Gorda, FL (US); Dwight G. Shepard, Punta Gorda, FL (US)

( * ) Notice: Subject to any disclaimer, the term of this patent is extended or adjusted under 35 U.S.C. 154(b) by 366 days.

(21) Appl. No.: 15/470,002

(22) Filed: Mar. 27, 2017

(65) Prior Publication Data

US 2017/0353027 A1    Dec. 7, 2017

Related U.S. Application Data

(60) Provisional application No. 62/346,835, filed on Jun. 7, 2016.

(51) Int. Cl.
| | | |
|---|---|---|
| *H02H 3/16* | (2006.01) | |
| *G08B 21/08* | (2006.01) | |
| *H02H 1/00* | (2006.01) | |
| *G01R 31/02* | (2006.01) | |

(52) U.S. Cl.
CPC .............. *H02H 3/16* (2013.01); *G01R 31/025* (2013.01); *G08B 21/082* (2013.01); *H02H 1/0007* (2013.01); *H02H 3/167* (2013.01)

(58) Field of Classification Search
CPC ........ H02H 3/16; H02H 3/167; H02H 1/0007; G01R 31/025; G08B 21/082
USPC .......................................................... 361/42
See application file for complete search history.

(56) References Cited

U.S. PATENT DOCUMENTS

| | | | |
|---|---|---|---|
| 8,643,360 B1* | 2/2014 | Cargill | G01R 19/16576 324/96 |
| 2006/0052956 A1* | 3/2006 | Lee | H02H 5/083 702/57 |
| 2014/0062512 A1* | 3/2014 | Kiing, Jr. | G01R 19/00 324/713 |

* cited by examiner

*Primary Examiner* — Kevin J Comber

(57) ABSTRACT

A device for detecting and potentially eradicating a leakage voltage from a water body comprises at least one wire sensor probe to receive the leakage voltage in the water body. The device comprises a voltage sensing circuit operable for receive the leakage voltage, and generate a voltage signal based on the leakage voltage. The device comprises a trigger circuit to receive the voltage signal, based on magnitude of the voltage signal being greater than a predefined threshold value. The trigger circuit activates an alarm circuit, and activates a circuit breaker. The circuit breaker, in response to activation of the circuit breaker, disconnects a power supply from the at least one voltage source immersed in the water body, thereby eradicating the leakage current from the water body if the leakage voltage is caused by the activated circuit breaker.

13 Claims, 9 Drawing Sheets

DEVICE FOR DETECTING AND ERADICATING A LEAKAGE AND/OR STRAY CURRENT IN/FROM A WATER BODY

CROSS REFERENCE TO APPLICATION

This patent application claims the benefit of U.S. Provisional Application No. 62/346,835 filed on Jun. 7, 2016. The above provisional application is incorporated by reference herein in its entirety.

BACKGROUND OF THE INVENTION

A. Technical Field

The present invention relates generally to the technical field of leakage and/or stray voltage monitoring and alarm systems, and more specifically relates to a stand-alone device for detecting and eradicating a leakage and/or stray voltage from a water body, such as a swimming pool, spa or near to a boat slip or dock.

B. Description of Related Art

Many different types of electrical devices are used in, around and under water bodies. Examples of such electrical devices include, but are not limited to, immersed electrical pumps, immersed electrical lights, and underwater water gear (e.g., scooters). The electrical devices derive electric power (AC or DC) from electric power supplies. Often, because of faulty wiring in the electrical devices, electric power leaks into the water as leakage or stray voltage. Typically, leakage or stray voltage in water bodies such as oceans, lakes, reservoirs, swimming pools, and spas, are hazardous for several reasons. For example, the leakage and/or stray voltage are often causes of electrocution and/or electric shock drowning. Every year people are electrocuted or seriously shocked when the electrical wiring short circuits electrifying their swimming pools, spas, and the like. Further, the voltage generates leakage currents that damage metallic objects immersed in water by inducing electrolysis on the metallic objects. Examples of the metallic objects include hand rails, ladders, boat propellers, boat anchors, and chains. The leakage and/or stray voltage in the water bodies have to be detected and an alarm sounded warning of the danger.

In one example, the leakage of a voltage can generate currents that are detected and suppressed by an Immersion Detection Circuit Interrupter (IDCI) device. The IDCI device suppresses the leakage current by disconnecting an electric power source from a plurality of electric devices immersed in the water bodies. The IDCI device comprises a live terminal connected to a live wire of the electric power source and a neutral terminal connected to a neutral wire of the electric power source. In one example, the IDCI device compares current in the live terminal with current in the neutral terminal. It is known in the art that differences between the current in the live terminal and the current in the neutral terminal are caused by the leakage currents. As a result, the current in the live terminal being unequal with the current in the neutral terminal indicates the presence of leakage currents in the water body. The IDCI device disconnects the plurality of electric devices from the power source, thereby removing the leakage currents contributed by the plurality of electrical devices from the water body. However, the IDCI device has a serious drawback. Even though, the IDCI device monitors current input and output from the plurality of electrical devices connected to the IDCI device, the water body is liable to have leakage currents leaked by other electric devices immersed in the water body. The IDCI device fails to alert human beings about presence of the additional leakage and/or stray currents in the water body. Further, existing IDCI devices are expensive to manufacture and are difficult to install. Existing IDCI devices are made of expensive, irreplaceable components. The above disadvantages place economic restrictions on widespread use of IDCI devices.

Therefore, there is a need in the field for a low cost device having features of alerting people of the presence of leakage and/or stray voltage in water bodies and eradicating the leakage and/or stray voltage from the water bodies.

SUMMARY OF THE INVENTION

The present invention relates to a device having features of alerting people of the presence of leakage and/or stray voltage in water bodies. If the source of the voltage is from a monitored Ground Fault Interrupter (GFI) circuit the device can shut the circuit off.

In one embodiment of the present invention, the device for eradicating the leakage voltage from the water body comprises at least one wire sensor probe to sense the leakage voltage in the water body. The leakage voltage emanates from at least one voltage source immersed in the water body. Further, the device comprises a voltage sensing circuit. Further, the device comprises a trigger circuit to receive the voltage signal, based on a magnitude of the voltage signal being greater than a predefined threshold value. The trigger circuit is operable to activate an alarm circuit and switch off a GFI circuit breaker. The circuit breaker, in response to activation of the circuit breaker, disconnects a power supply from the at least one voltage source immersed in the water body, thereby eradicating the voltage from the water body. The alarm circuit, if the tripped breaker does not remove the voltage in response to activation of the alarm circuit, alerts a person about the danger of the leakage voltage in the water body.

In an embodiment of the present invention, the wire sensor probe is a 14 gauge solid copper insulated wire and at least a six (6) inch length of silver solder. In another embodiment of the present invention, the alarm circuit is connected to at least one of a siren, a light, and a monitored alarm system. In yet another embodiment of the present invention, the circuit breaker is at least one of a circuit breaker type Ground Fault Circuit Interrupter (GFCI) and a receptacle type GFCI. In yet another embodiment of the present invention, the voltage sensing circuit is at least one of a transistor based current sensing circuit, an operational amplifier based current sensing circuit, and/or a resistor based current sensing circuit. In yet another embodiment of the present invention, the trigger circuit is at least one of a Bipolar Junction Transistor (BJT) based trigger circuit and an operational amplifier (Opamp) based trigger circuit. In yet another embodiment of the present invention, the at least one current source is at least one of an underwater light, an immersed water pump, an underwater scooter, and an electric boat engine.

In one embodiment of the present invention, a method of detecting and eradicating a leakage and/or stray voltage from a water body comprises receiving, at a voltage sensing circuit, the leakage and/or stray voltage in the water body. The leakage voltage emanates from at least one voltage source immersed in the water body. Further, the method comprises receiving the voltage signal by a trigger circuit, based on magnitude of the voltage signal being greater than a predefined threshold value. Further, the method comprises activating an alarm circuit by the trigger circuit, wherein the alarm circuit, in response to activation, alerts a person about presence of the leakage voltage in the water body. Further, the method comprises tripping one or more GFI circuit breakers by the trigger circuit. The circuit breaker(s), in response to activation, disconnects a power supply from the at least one current source immersed in the water body, thereby eradicating the leakage current from the water body.

DETAILED DESCRIPTION OF EMBODIMENTS

A description of embodiments of the present invention will now be given with reference to the Figures. It is expected that the present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

Figure 1:
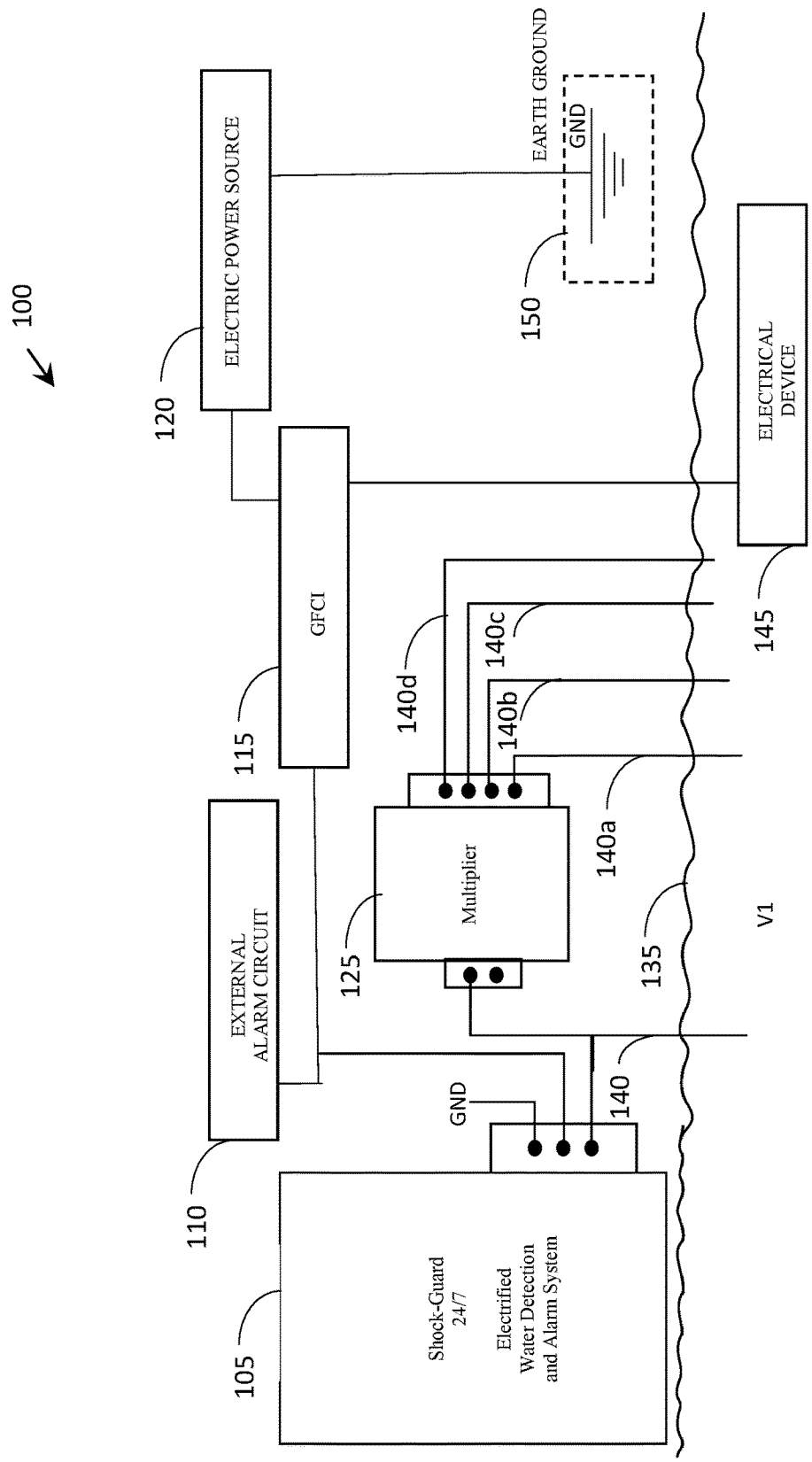
FIG. 1 is a block diagram of an body of water environment in which the present invention is implemented, in accordance with the various embodiments of the present invention.

FIG. 1 is a block diagram of an environment 100 in accordance with which various embodiments of the present invention are implemented. The environment 100 comprises a voltage monitoring and alarm device 105, an external alarm circuit 110, a Ground Fault Circuit Interrupter (GFCI) 115, an electric power source 120, a multiplier 125, and an electrical device 145. The electrical device 145 is at least one of an electric motor, an electric underwater lamp, an underwater scooter and an electric boat propeller. The electrical device 145 receives power from the electrical power source 120 via the GFCI 115 and is earth grounded through the electric power source at ground 150. The electrical device 145 leaks the leakage voltage V1 into the water body 135. The GFCI 115 is at least one of a circuit breaker type GFCI and a receptacle type GFCI. The electric device 145 is immersed in a water body 135. Examples of the water body 135 include, but are not limited to swimming pools, water tanks, lakes, reservoirs, and ocean. Further, a single wire sensor probe 140 or plurality of wire sensor probes (140a, 140b, 140c, and 140d) is also immersed in the water body 135. The single wire sensor probe 140 is connected to device 105 while plurality of wire sensor probes (140a, 140b, 140c, and 140d) is connected to the voltage monitoring and alarm device 105, via the multiplier 125. An example of the wire sensor probe include a 14-gauge solid copper insulated wire terminated with at least six (6) inches of silver solder.

The single wire sensor probe 140 or the plurality of wire sensor probes (140a, 140b, 140c, and 140d) receives a leakage voltage V1 from the water body 135. If a plurality of wire sensor probes are used, multiplier 125 transmits the leakage voltage V1 into the leakage voltage monitoring device 105. The leakage voltage monitoring device 105. If the magnitude of the leakage voltage V1 is greater than a predefined threshold voltage, then the leakage voltage monitoring device 105 activates the internal alarm and an optional external alarm circuit 110. In one example, the predefined threshold voltage is a zener breakdown voltage. The alarm circuit 110 activates at least one of a siren, a light, and a monitored alarm. The internal alarm and/or alarm circuit 110, in response to activation, gives out a human perceptible indication to alert human beings of presence of the leakage voltage in the water body 135. The alarm circuit 110, in its embodiment as a siren, can be a 6-12V DC siren (outdoor @ 105 DB) powered by the leakage current monitoring device 105. Further, the leakage current monitor device 105 activates the GFCI 115. The GFCI 115 in response to activation, disconnects the electrical device 145 from electrical power source 120, thereby eradicating the leakage voltage V1 from the water body. The activation of the GFCI 115 can also act to trip a relay for a security system (not shown).

Figure 2:
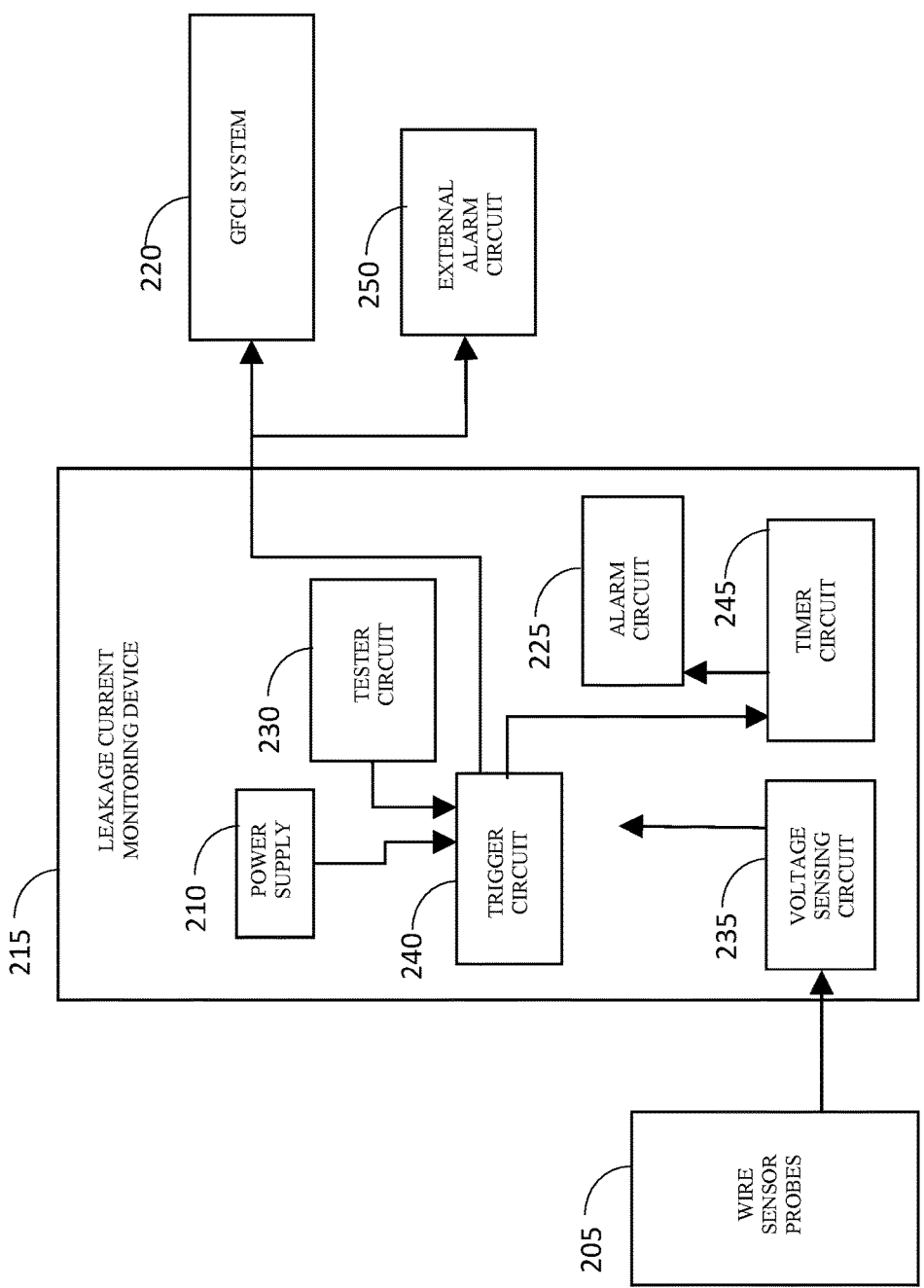
FIG. 2 is a schematic block diagram of a device for detecting/eradicating a leakage and/or stray voltage from a body of water, according to an embodiment of the present invention.

FIG. 2 is a schematic diagram of a device 215 for eradicating a leakage voltage V1 from a water body, according to another embodiment of the present invention. In one example, the device 215 is a leakage voltage monitoring device 215. The leakage voltage monitoring device 215 is connected to wire sensor probes 205, an internal power supply 210, a Ground Fault Circuit Breaker (GFCI) system 220, an internal alarm circuit 225, and an external alarm circuit 250. The wire sensor probes 205 are immersed in the water body. An example of the water body includes but is not limited to a swimming pool, a reservoir, an ocean and a lake. It is noted that the present invention is implemented in marinas, docks, water tanks, swimming pools, and beaches.

The leakage voltage monitoring device 215 receives electrical power via the internal power supply 210. In one example, the power supply 210 is a 9-volt battery. Further, the leakage voltage monitoring device 215 receives the leakage voltage in the water body via the wire sensor probes 205. The leakage voltage emanates from one or more voltage sources (not shown) immersed in the water body. In one example, the voltage source is an electrical device (not shown) immersed in the water body. Example of the electrical device includes but is not limited to an electric motor, an electric underwater lamp, and an electric boat propeller. The electric device leaks the leakage voltage into the water body. The electrical device derives electric power from a high voltage power supply. Examples of the high voltage power supply include, but are not limited to an electric power generator, a battery, and an electric power plant. The electrical device is connected to the high voltage power supply via the GFCI system 220 connected to the leakage voltage monitoring device 215.

As mentioned above, the leakage voltage monitoring device 215 receives the leakage voltage in the water body via the wire sensor probes 205. The leakage voltage monitoring device 215 comprises a voltage sensing circuit 235, a trigger circuit 240, a timer circuit 245, and an alarm circuit 225.

In the leakage voltage monitoring device 215, the leakage voltage is received at the voltage sensing circuit 235. Examples of the voltage sensing circuits 235 include, but is not limited to a IC based voltage sensing circuit, a Bipolar Junction Transistor based voltage sensing circuit, and a MOSFET based voltage sensing circuit. The voltage sensing circuit 235 receives the leakage voltage. If the magnitude of the voltage is greater than a predefined threshold voltage, then the voltage sensing circuit 235 generates a second voltage signal V2 across at least one resistor.

In one example, the voltage sensing circuit 235, after receiving the leakage voltage, passes the leakage voltage through at least one resistor and thereby generates a second voltage signal V2 which is clamped by a zener breakdown voltage.

The voltage sensing circuit 235 transmits the voltage signal V2 to the trigger circuit 240. The trigger circuit 240 is at least one of a Bipolar Junction Transistor (BJT) based trigger circuit, a Schmitt trigger, an operational amplifier (Opamp) based trigger circuit, and a resistor based trigger circuit. The trigger circuit 240 is operable to activate the timer circuit 245 causing the internal alarm to chirp and the GFCI system 220.

The timer circuit 245 sends a voltage pulse V3 to the alarm circuit 225 at regular, predefined time intervals. In one example, the timer circuit 245 activates the alarm circuit 225 every six seconds.

The GFCI system 220 is at least one of a circuit breaker type GFCI and a receptacle type GFCI. As mentioned above, the GFCI system 220 is connected to the leakage voltage monitoring device 215. The leakage voltage monitoring device 215 is operable to activate the GFCI system 220 via the trigger circuit 240. In one example, the leakage voltage monitoring system 215 is connected to a neutral terminal of the GFCI system 220. To activate the GFCI system 220, the leakage voltage device sends a current to the neutral terminal of the GFCI system 220. The GFCI system 220 is operable to disconnect the electrical device from the high voltage power supply, in response to activation.

Further, the leakage voltage monitoring device 215 can control at least one of a siren, a light, or alarm system using the same output that activates the GFCI system. The alarm circuit 215, in response to activation, gives out a human perceptible indication to alert human beings about presence of the leakage current in the water body.

Further, the leakage voltage monitoring device 215 further comprises a tester circuit 230. The tester circuit 230 gives a humanly perceptible indication of the leakage voltage monitoring device 215 being active and functioning. In one example, the tester circuit 230 comprises a reed relay, resistor, and a Light emitting Diode (LED). The test circuit 230 is activated using a magnet to close the reed relay. This light the LED indicating the test is valid and will activate the trigger circuit 240. If the unit is functional the alarm circuit 225 with sound within ten (10) seconds.

Figure 3:
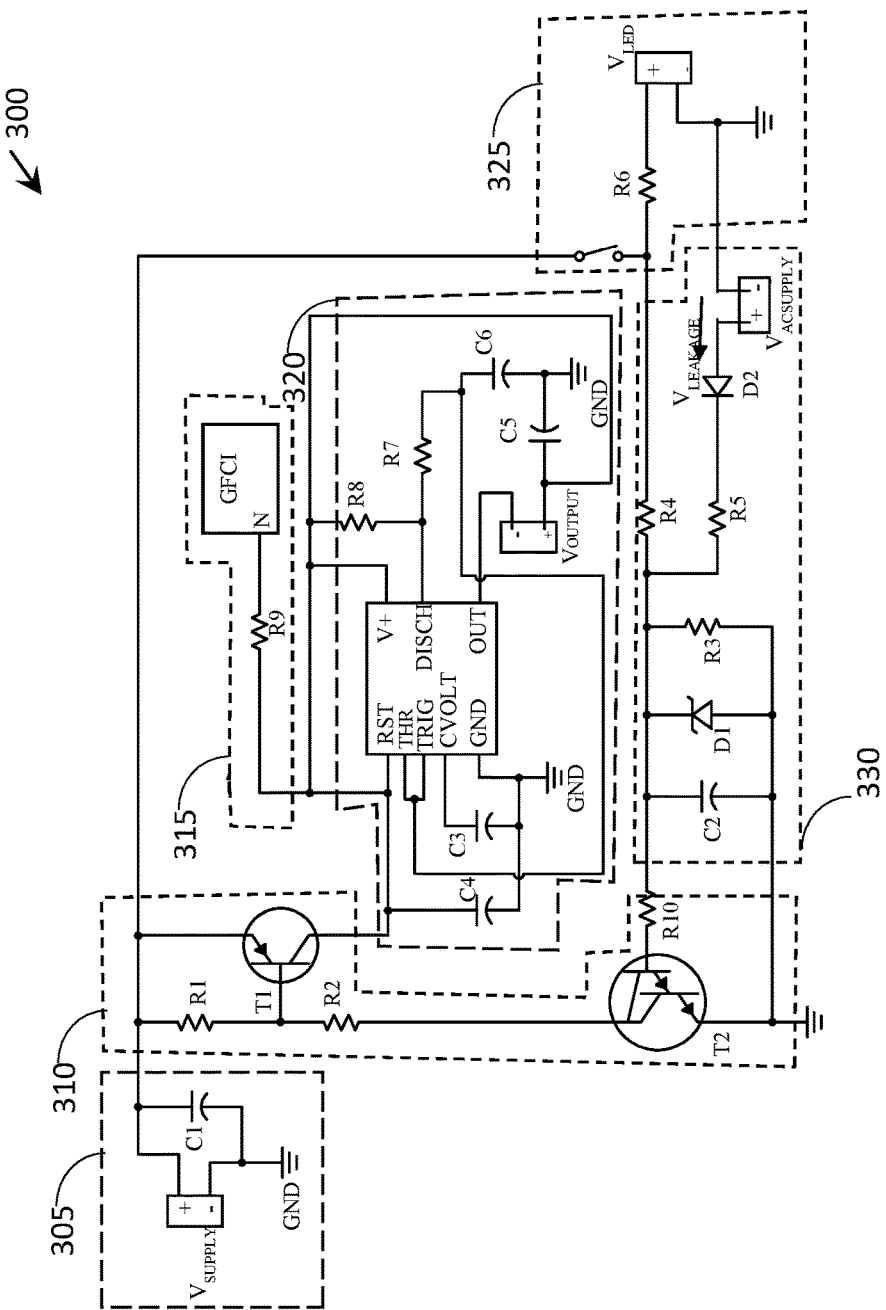
FIG. 3 is a circuit diagram of a device for detecting/eradicating a leakage and/or stray voltage from a body of water, according to an embodiment of the present invention.

FIG. 3 is a circuit diagram of a device 300 for eradicating a leakage voltage from a water body, according to another embodiment of the present invention. The leakage voltage V1 is hereafter referred to as leakage voltage $V_{LEAKAGE}$. In one example the device 300 is a leakage voltage monitoring device 300. The leakage voltage monitoring device 300 is connected to wire sensor probes (not shown), a power supply 305, a Ground Fault Circuit Breaker (GFCI) system (not shown), and an alarm circuit (not shown). The wire sensor probes are immersed in the water body. An example of the water body includes but is not limited to a swimming pool, a reservoir, an ocean and a lake. It is noted that the present invention is implemented in marinas, docks, water tanks, swimming pools, and beaches.

The leakage voltage monitoring device 300 receives electrical power via the power supply input 305. The power supply 305 supplies a supply voltage VSUPPLY to the leakage voltage monitoring device 300. In one example, the power supply 305 is a 9-volt battery. Further, the leakage voltage monitoring device 300 receives the leakage voltage $V_{LEAKAGE}$ in the water body via the wire sensor probes. The leakage voltage emanate from one or more current sources (not shown) immersed in the water body. In one example, the current source is an electrical device (not shown) immersed in the water body. Example of the electrical device includes but is not limited to an electric motor, an electric underwater lamp, and an electric boat propeller. The electric device leaks the leakage voltage into the water body. In one example, the electric device leaks the leakage voltage $V_{LEAKAGE}$ into the water body. The electrical device derives electric power from a high voltage power supply. Examples of the high voltage power supply include, but is not limited to an electric power generator, a battery, and an electric power plant. The electrical device may be connected to the high voltage power supply via the GFCI system connected to the leakage voltage monitoring device 300.

As mentioned earlier, the leakage voltage monitoring device 300 receives the leakage voltage $V_{LEAKAGE}$ in the water body via the wire sensor probes. The leakage voltage monitoring device 300 comprises a trigger circuit 310, a GFCI driver circuit 315, a timer circuit 320, a tester circuit 325, and a voltage sensing circuit 330. The leakage voltage $V_{LEAKAGE}$ is received at the voltage sensing circuit 330. Examples of the voltage sensing circuits include, but is not limited to an IC based current sensing circuit, a Bipolar Junction Transistor based voltage sensing circuit, and a MOSFET based voltage sensing circuit. The voltage sensing circuit 330 receives the leakage voltage $V_{LEAKAGE}$ and generates a first voltage signal V1 based on the leakage voltage $V_{LEAKAGE}$. Further, the voltage sensing circuit compares the first voltage signal V1 with a predefined threshold voltage. In one example, the predefined threshold voltage is a zener breakdown voltage.

In one example, the voltage sensing circuit 330, after receiving the leakage voltage, passes the leakage voltage through at least one resistor and thereby generates a second voltage signal V2 across at least one resistor. Further, the current sensing circuit 330 generates the first voltage signal V1 if magnitude of the second voltage signal V2 is greater than the predefined threshold voltage. In one example, the predefined threshold voltage is a zener breakdown voltage. A circuit diagram of an exemplary implementation of the current sensing circuit 330 is illustrated in FIG. 4.

Figure 4:
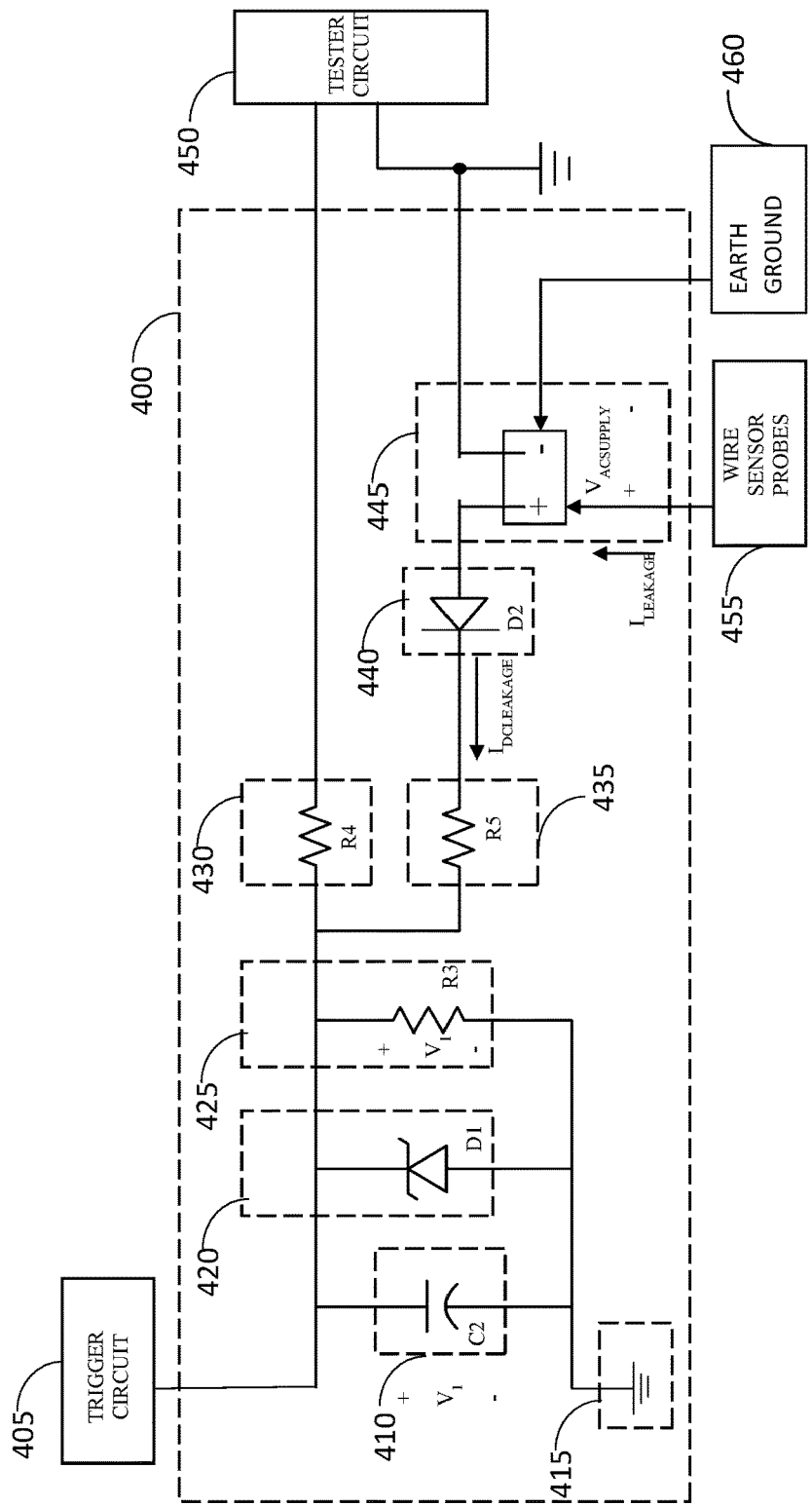
FIG. 4 is a circuit diagram of a current sensing circuit, according to an embodiment of the present invention.

Referring to FIG. 4, a voltage sensing circuit 400 comprises a first capacitor C2 410, a zener diode D1 420, a first resistor R3 425, a second resistor R4 430, a third resistor R5 435, a rectifier diode D2 440, and a wire sensor probe terminal 445. Further, the voltage sensing circuit 400 is connected to a trigger circuit 405, a ground terminal 415, a tester circuit 450, wire sensor probes 455 and earth ground 460. The wire sensor probe terminal 445 connects the wire sensor probes 455 to the voltage sensing circuit 400. As mentioned earlier, the voltage sensing circuit 400 receives a leakage voltage $V_{LEAKAGE}$ at the wire sensor probe terminal 445 via the wire sensor probe 455. In one example, the leakage voltage $V_{LEAKAGE}$ is an alternating voltage (AC). The wire sensor probe terminal 445 has an AC supply voltage $V_{ACSUPPLY}$. The leakage voltage $V_{LEAKAGE}$ flows from the wire sensor probe terminal 445 to the rectifier diode D2 440. In one example, the rectifier diode D2 440 is a rectifier power diode. The second diode D2 440 is arranged in a half wave rectifier configuration. The second diode D2 440 rectifies the leakage voltage I into a DC voltage $V_{DCLEAKAGE}$. Further, the DC leakage voltage $V_{DCLEAKAGE}$ flows into a network of resistors comprising the first resistor R3 425, the third resistor R5 435. The network of resistors has a voltage divider arrangement. The network of resistors step down the rectified AC supply voltage $V_{ACSUPPLY}$ to a first voltage V1 across the first resistor R3 425. Further, the voltage across resistor R3 425 is clamped by Zener diode 420. Further, the second resistor 430 transmits a DC voltage from the tester circuit 450 when in test mode. In an exemplary illustration of the present invention, the first resistor R3 425 has a resistance of 100 kilo ohms, the third resistor 435 has a resistance of 10 kilo ohms, the AC supply voltage is 240V and the first voltage V1 is 5 V. The first resistor R3 425 is connected in parallel to the first diode D1 420, and the first capacitor C2 410.

The first diode D1 420 is a zener diode. Further, the first diode D1 420 is arranged in reverse bias with respect to the first voltage V1. As a result, the first diode D1 420 offers high resistance to flow of current. It is known to a person skilled in the art that zener diodes is liable to undergo a zener breakdown if a voltage applied to the zener diode in reverse bias exceeds a zener breakdown voltage Vz. The zener diodes conduct electricity with minimal resistance during zener breakdown. Further, voltage across the zener diode reduces to the zener breakdown voltage Vz.

In one example, the zener breakdown voltage Vz is 5.0 volts. If the first voltage V1 exceeds a zener breakdown voltage of the first diode D1 420, the first diode D1 420 undergoes zener breakdown and conducts electricity with minimal resistance. Moreover, the first voltage V1 reduces to the zener breakdown voltage. The first capacitor C2 410 suppresses signal noise from the first voltage V1. Moreover, due to the voltage V1 being reduced to the zener breakdown voltage Vz, current flows to the trigger circuit.

Figure 5:
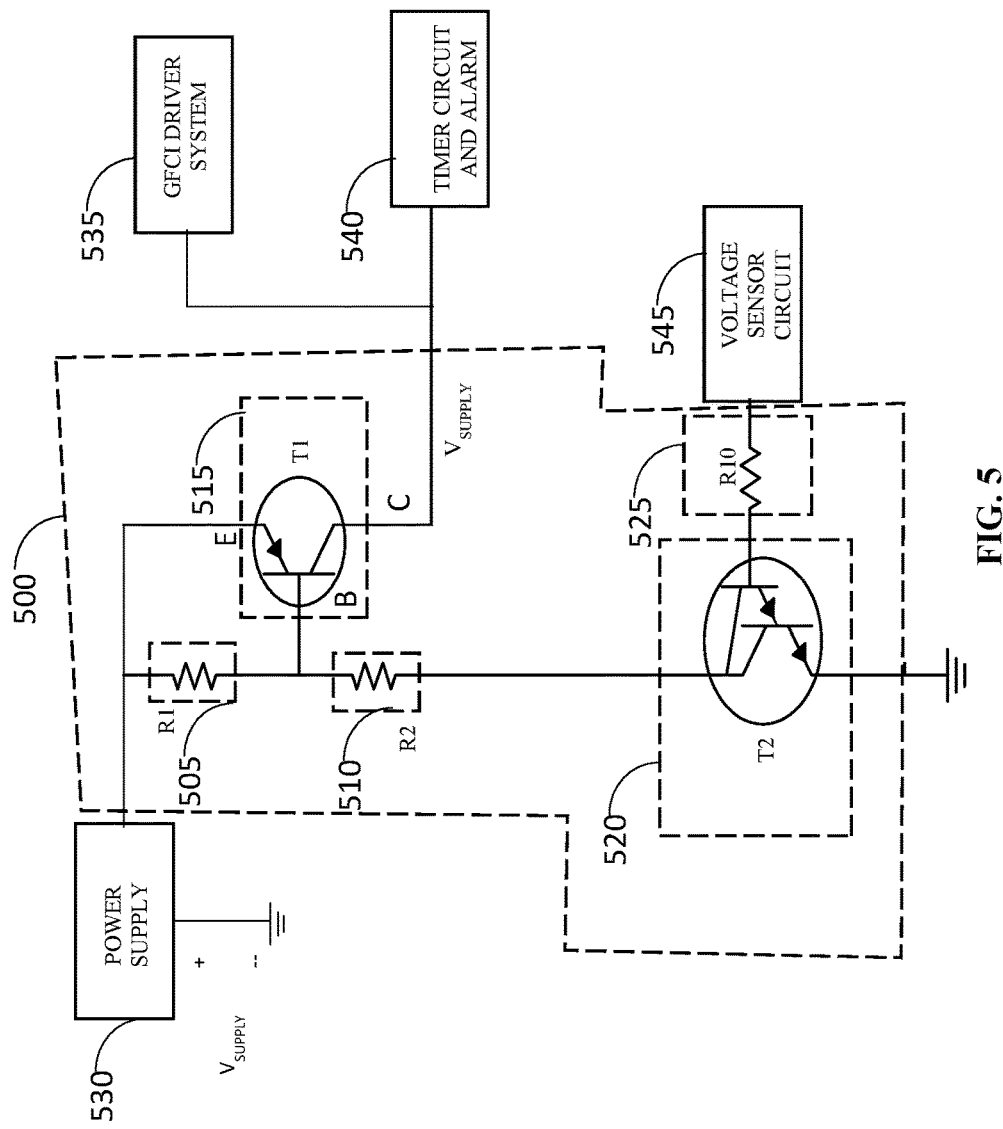
FIG. 5 is a circuit diagram of a trigger circuit, according to an embodiment of the present invention.

Now referring back to FIG. 3, the current sensing circuit 330 transmits the first voltage signal V1, reduced to the zener breakdown voltage Vz, into the trigger circuit 310. The trigger circuit 310 is at least one of a Bipolar Junction Transistor (BJT) based trigger circuit, a Schmitt trigger, an operational amplifier (Opamp) based trigger circuit, and a resistor based trigger circuit. The trigger circuit 310 is operable to activate the timer circuit 320 and the GFCI system 315. A circuit diagram of an exemplary implementation of the trigger circuit 310 is illustrated in FIG. 5. Note that there is not current load on the power supply 305 until the trigger circuit activates.

Referring to FIG. 5, a trigger circuit 500 comprises a first resistor R1 505, a second resistor R2 510, a first transistor T1 515, a second transistor T2 520, a third resistor R10 525. Further, the trigger circuit 500 is connected to a power supply 530, a Ground Fault Circuit Interrupter (GFCI) driver circuit 535, a timer circuit 540 and a voltage sensing circuit 545. The power supply 530 supplies a voltage $V_{SUPPLY}$ to the trigger circuit 500. The power supply 530 is connected to the first resistor 505 and the first transistor T1 515 in the trigger circuit 500. In one example, the first transistor T1 515 is a PNP Bipolar Junction Transistor. Furthermore, the first transistor T1 515 is connected in common collector configuration. The first transistor T1 515 comprises a base terminal, an emitter terminal, and a collector terminal. The base terminal of the first transistor T1 515 is connected to the power supply 530 via the first resistor R1. Further, the emitter terminal of the first transistor T1 515 is connected to the power supply 530. Moreover, the collector terminal of the first transistor T1 515 is connected to the timer circuit 540 and the GFCI driver system 535. Furthermore, the base terminal of the first transistor T1 515 is connected to the second transistor T2 520 via the second resistor R2 510. The second transistor T2 520 comprises a pair of transistor connected as a Darlington pair. Furthermore, the second transistor T2 520 comprises an emitter terminal, a base terminal, and a collector terminal. The collector terminal of the second transistor T2 520 is connected to the base terminal of the first transistor T1 515 via the second resistor R2 510. The emitter terminal of the second transistor T2 520 is connected to ground. The base terminal of the second transistor T2 520 is connected to the voltage sensor circuit 545 via the third resistor 525. If the second transistor T2 520 is in OFF state, the base terminal of the first transistor T1 515 is disconnected from ground. As a result, the first transistor T1 515 stays in OFF state. However, if the second transistor T2 520 is in ON state, the second transistor T2 520 connects the base terminal of the first transistor T1 515 to ground, via the second resistor R2 510. Thus, if the second transistor T2 520 switches ON, then the first transistor T1 515 switches ON. The second transistor T2 520 is operable to be switched ON by the voltage sensing circuit 545.

As mentioned earlier, the voltage sensing circuit 545 transmits the first voltage V1 to the trigger circuit 500 and increases the current flowing from the trigger circuit 500 to the current sensing circuit 545. The current sensing circuit 545 is connected to a base terminal of the second transistor T2 520 via the third resistor R10 525. When current flow in the base terminal of the second transistor T2 520 increases, the second transistor T2 520 turns ON to one of an active state and a saturated state. As mentioned earlier, if the second transistor T2 520 is in ON state, the first transistor T1 515 turns ON into one of active state and a saturated state. The first transistor T1 515 conducts and thereby powers up the rest of the circuit (i.e., connects the power supply 530 with the GFCI driver 535 and a timer circuit 540). The trigger circuit 500 transmits the voltage $V_{SUPPLY}$ to the timer circuit 540 and the GFCI driver system 535. The trigger circuit 500 thereby activates the timer circuit 540 and the GFCI driver system 535. A circuit diagram of an exemplary implementation of a GFCI driver system 535 is illustrated in FIG. 6.

Figure 6:
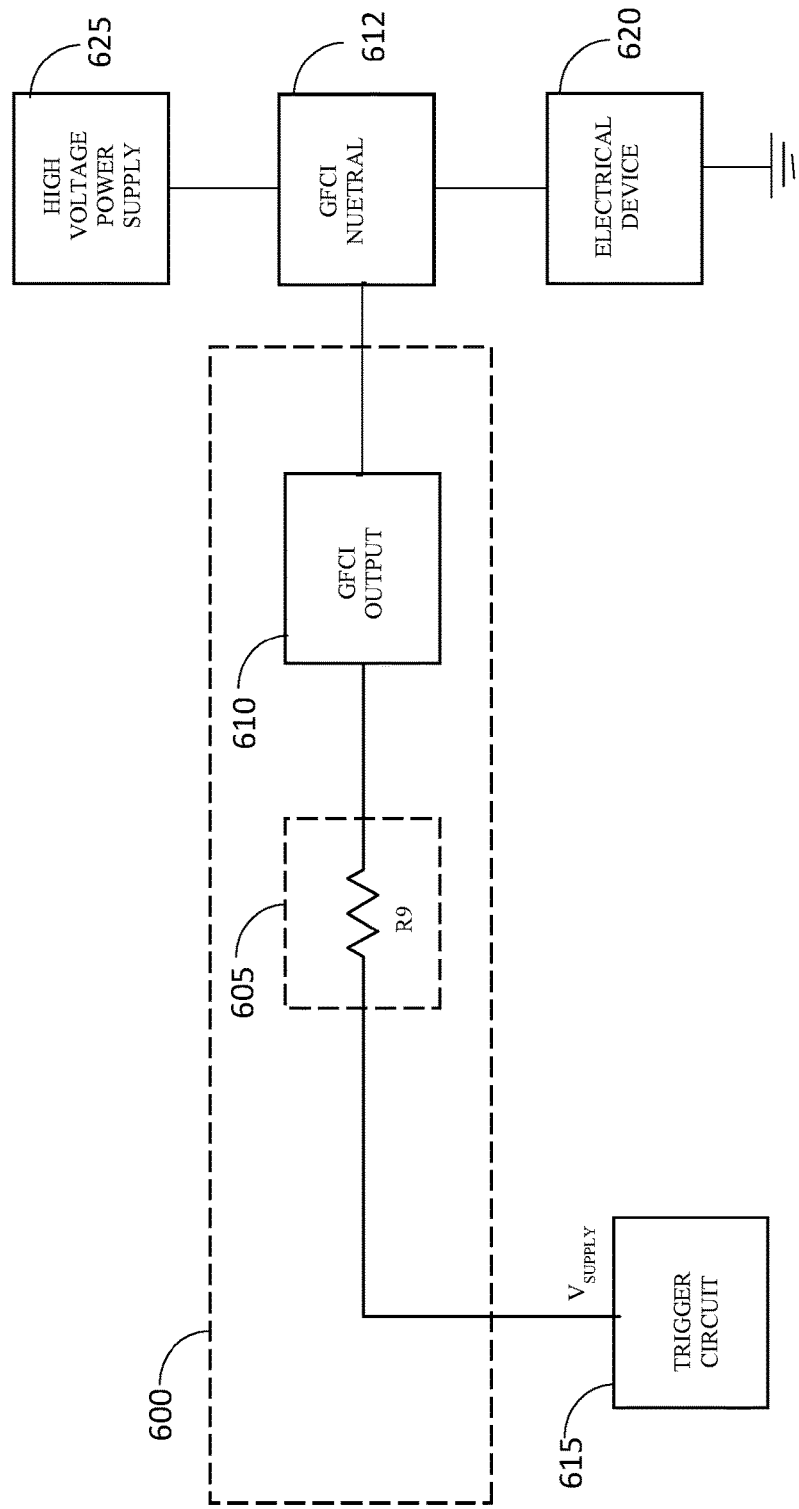
FIG. 6 is a circuit diagram of a Ground Fault Circuit Interrupter (GFCI) driver circuit, according to an embodiment of the present invention.

Referring to FIG. 6, a GFCI driver system 600 comprises a first resistor R9 605 and a Ground Fault Circuit Interrupter (GFCI) output terminal 610. The GFCI output terminal 610 will be connected to the neutral of an external Ground Fault Circuit Interrupter (GFCI) 612 The GFCI is at least one of a circuit breaker type GFCI and a receptacle type GFCI. As mentioned above, the GFCI system 220 is connected to a trigger circuit 615 via the first resistor R9 605. The trigger circuit 615 is operable to activate the GFCI output terminal 610. In one example, the trigger circuit 615 is connected to a neutral terminal of the GFCI 612 via GFCI driver system 600. To activate the GFCI 612, the trigger circuit 615 sends a current to the neutral terminal of the GFCI 612.

As mentioned earlier, a leakage voltage in a water body emanates from one or more voltage sources immersed in the water body. In one example, the voltage source is an electrical device 620 immersed in the water body. Example of the electrical device 620 includes but is not limited to an electric motor, an electric underwater lamp, and an electric boat propeller. The electrical device 620 derives electric power from a high voltage power supply 625. Examples of the high voltage power supply include, but is not limited to an electric power generator, a battery, and an electric power plant. The electrical device 620 is connected to the high voltage power supply 625 via the GFCI 612. If the trigger circuit 615 sends the current to the neutral terminal of the GFCI 612 and activates the GFCI 612, then the GFCI 612 disconnects the electrical device 620 from the high voltage power supply 625.

Referring back to FIG. 3, the trigger circuit 310 is operable to activate the timer circuit 320 as well. The timer circuit 320 sends a voltage pulse V3 to an alarm circuit (not shown) at regular, predefined time intervals and thereby activates the alarm at regular predefined time intervals. In one example, the timer circuit 320 activates the alarm circuit every six seconds. The alarm circuit controls at least one of a siren, a chirper, a light, and a speaker. The alarm circuit, in response to activation, gives out a human perceptible indication via one of the siren, the chirper, the light, and the speakers to alert human beings about presence of the leakage voltage in the water body. A circuit diagram of the timer circuit 320 is illustrated in FIG. 7.

Figure 7:
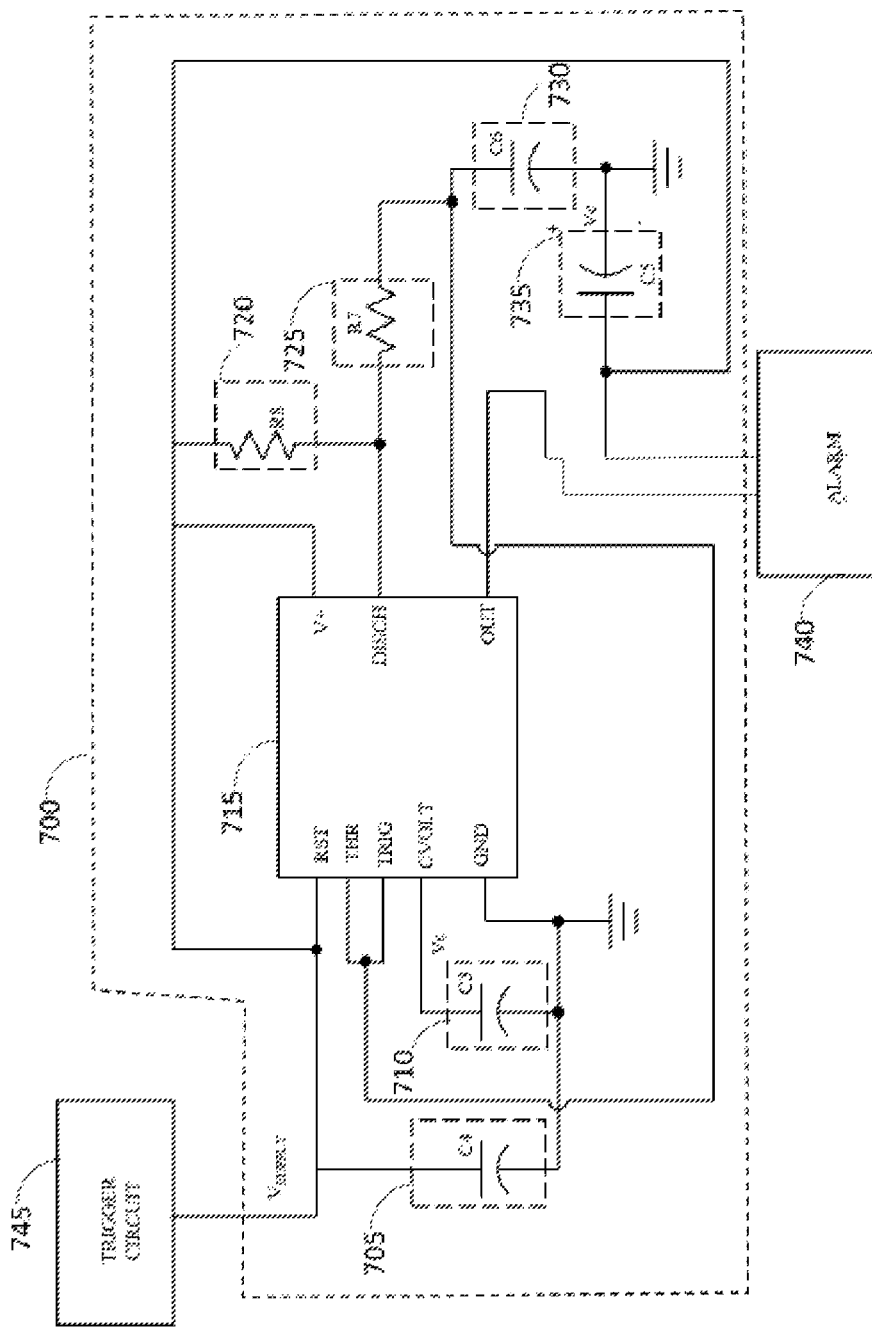
FIG. 7 is a circuit diagram of a timer circuit, according to another embodiment of the present invention.

Referring to FIG. 7, a timer circuit 700 comprises a first capacitor C4 705, a second capacitor C3 710, a timer Integrated Circuit (IC) 715, a first resistor R8 720, a second resistor R7 725, a third capacitor C6 730, a fourth capacitor C5 735. The timer circuit 700 is connected to a trigger circuit 745 and an alarm 740. In one example, the alarm 740 has a positive terminal and a negative terminal. In one example, the timer IC 715 is an LM 555A IC. The timer IC 715 comprises a reset terminal RST, a voltage terminal V+, a threshold terminal THR, a trigger terminal TRIG, a Control voltage terminal CVOLT, a ground terminal GND, a discharge terminal DSCHG, and an output terminal OUT. The reset terminal RST is an input terminal. If a negative voltage pulse is applied to the RST terminal, then the timer IC 715 resets. It is known in the art that the reset terminal RST is connected to a power supply in order to avoid false reset. As mentioned earlier, the trigger circuit 745 supplies a voltage $V_{SUPPLY}$ to the timer circuit 700. The reset terminal RST is connected to the voltage $V_{SUPPLY}$ the trigger circuit 745 to avoid false reset. Further, the trigger circuit 745 is connected to the voltage terminal V+. The Reset terminal RST and the voltage terminal V+ are grounded via the first capacitor C4 705.

The first capacitor C4 705 protects the timer circuit 700 from power spikes received from the trigger circuit 745 by providing a conductive path for the power spikes to ground. Further, the trigger circuit 745 is connected to a positive terminal of the alarm 740. Further, the fourth capacitor 735 protects the alarm 740 from power spikes received from the trigger circuit 745 by providing a conductive path for the power spikes to ground. Moreover, the trigger circuit 745 is connected to the discharge terminal DSCH of the timer IC 715 via the second resistor R8 720. Further, the discharge terminal DSCH of the timer IC 715 is connected to ground via a series connection of the third resistor R7 725 and the third capacitor C6 730. Further, the threshold terminal THR of the timer IC 715 and the trigger terminal TRIG of the timer IC 715 are connected to the ground via the third capacitor C6 730. Further, the ground terminal GND of the timer IC 715 is connected to ground. Moreover, the control voltage terminal CVOLT is connected to ground via the second capacitor C3 710. The second capacitor C3 710 enables noise cancellation by providing a conductive path for signal noises in the timer IC 715 to travel to ground. The output terminal OUT of the timer IC 715 is connected to the negative terminal of the alarm 740.

To activate the timer circuit 700, the trigger circuit 705 supplies a voltage $V_{SUPPLY}$ to the voltage terminal V+ of the timer IC 715. The voltage $V_{SUPPLY}$ serves as supply voltage to the timer IC 715 and turns ON the timer IC 715. It is known to a person with ordinary skill in the art that the timer IC 715 has a first state of operation and a second state of operation. In the first state, the output terminal OUT is in HIGH state. It is noted that the negative terminal of the alarm 740 is connected to the output terminal OUT. Since the output terminal OUT is in HIGH state, and since the positive terminal of the alarm 740 is also connected to the voltage $V_{SUPPLY}$, the alarm 740 is inactive. In the second state, the output terminal OUT is in LOW state. Since the output terminal OUT is in LOW state, and since the positive terminal of the alarm 740 is also connected to the voltage $V_{SUPPLY}$, the alarm 740 is active in the second state of operation of the timer IC 715.

In the first state of operation, the discharge terminal DSCH offers HIGH input resistance. Further, the third capacitor C6 730 starts charging from the voltage $V_{SUPPLY}$ via a series connection of the second resistor R8 720, and the third resistor R7 725. Hence, a capacitor voltage Vc forms across the third capacitor C6 730. As mentioned earlier, the third capacitor C6 730 is connected to the threshold terminal THR of the timer IC 715 and the trigger terminal TRIG of the timer IC 715. Hence the voltage Vc across the third capacitor C6 730 is applied to the threshold terminal THR of the timer IC 715. It is known in the art that both the threshold terminal THR of the timer IC 715 and the trigger terminal TRIG of the timer IC 715 are input terminals. Further, it is known in the art that if the voltage Vc applied on the threshold terminal THR is one of greater than and equal to a voltage equivalent to $(2/3)*(V_{SUPPLY})$, then the timer IC 715 toggles state of the output terminal OUT from a HIGH state to a LOW state. As a result, the timer IC 715 toggles into the second state of operation.

In the second state of operation, the discharge terminal DSCH is grounded. Since the discharge terminal DSCH is connected to the third resistor R7 725 and the third capacitor C6 730, the third capacitor C6 730 discharges into the discharge terminal DSCH via the third resistor R7 725. As a result, the alarm 740 becomes active. The alarm 740, in response to activation, gives out a human perceptible indication via one of a siren, a chirper, a light, and a speaker to alert human beings about presence of a leakage voltage in a water body.

It is known to a person skilled in the art that if the voltage Vc applied on the threshold terminal THR and the trigger terminal TRIG is one of lesser than and equal to a voltage equivalent to $(1/3)*(V_{SUPPLY})$, then the timer IC 715 toggles state of the output terminal OUT from LOW to HIGH. Hence, the timer IC 715 toggles from the second state of operation to the first state of operation. Moreover, the timer IC 715 toggles the discharge terminal DSCH from a LOW state to a HIGH state. The discharge terminal DSCH is an input terminal and is has high input resistance during the HIGH state. Hence, the third capacitor C6 730 stops discharging into the discharge terminal DSCH. Further, the third capacitor C6 730 commences charging via the series connection of the first resistor R8 720 and the second resistor R7 725.

Referring back to FIG. 3, the leakage voltage monitoring device 300 further comprises the tester circuit 325. The tester circuit 320 gives a humanly perceptible indication of the leakage voltage monitoring device 300 being active and functioning. In one example, the tester circuit 320 comprises an Light Emitting Diode (LED). A circuit diagram of the tester circuit 325 is illustrated in FIG. 8.

Figure 8:
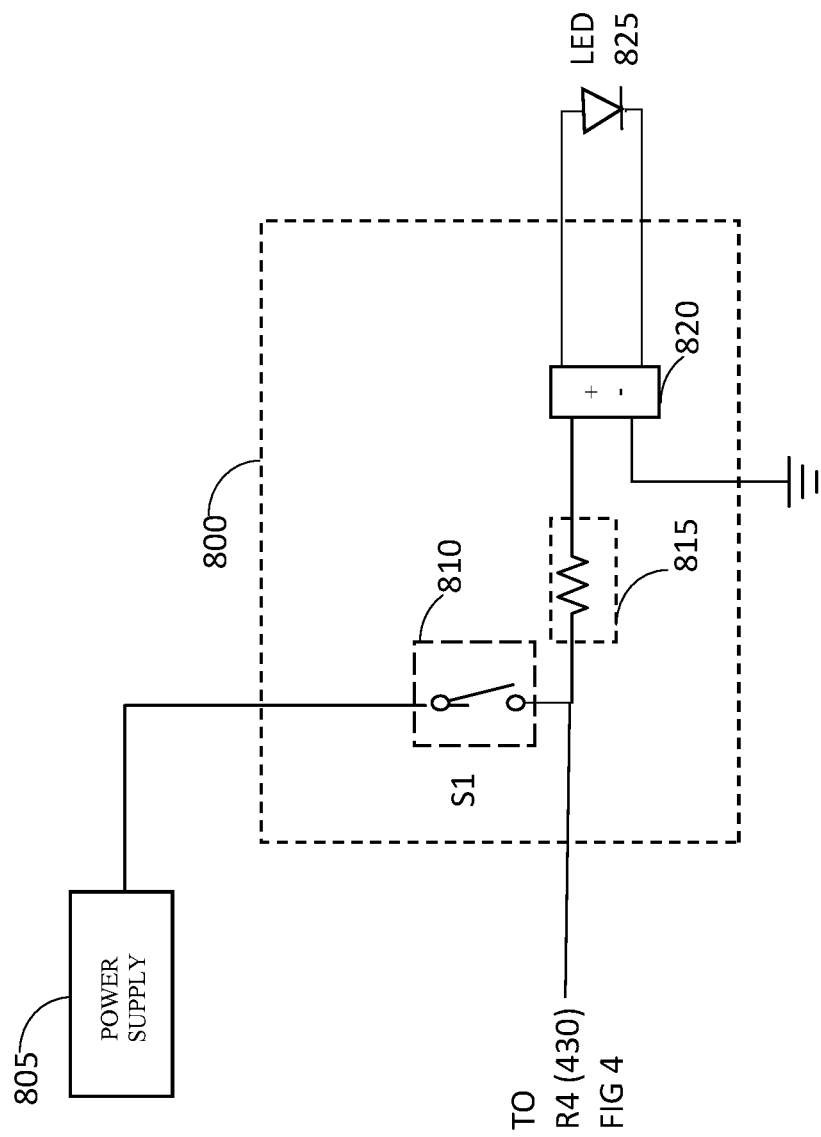
FIG. 8 is a circuit diagram of a tester circuit, according to an embodiment of the present invention.

Referring now to FIG. 8, a tester circuit 800 comprises a switch S1 810, a resistor 815, an output terminal 820 and a LED 825. The tester circuit 800 is connected to a power supply 805 and ground. If the switch is closed, a voltage forms on resistor 815 and on R4 430 in FIG. 4. The resistor 815 sets the current that lights LED 825. In one example, the switch S1 810 is a reed switch which is closed by using a magnet. The voltage that forms on R4 430 in FIG. 4 simulates a voltage on the Wire Sensor Probe(s) 455 in FIG. 4 thus activating the trigger circuit 405 in FIG. 4.

Figure 9:
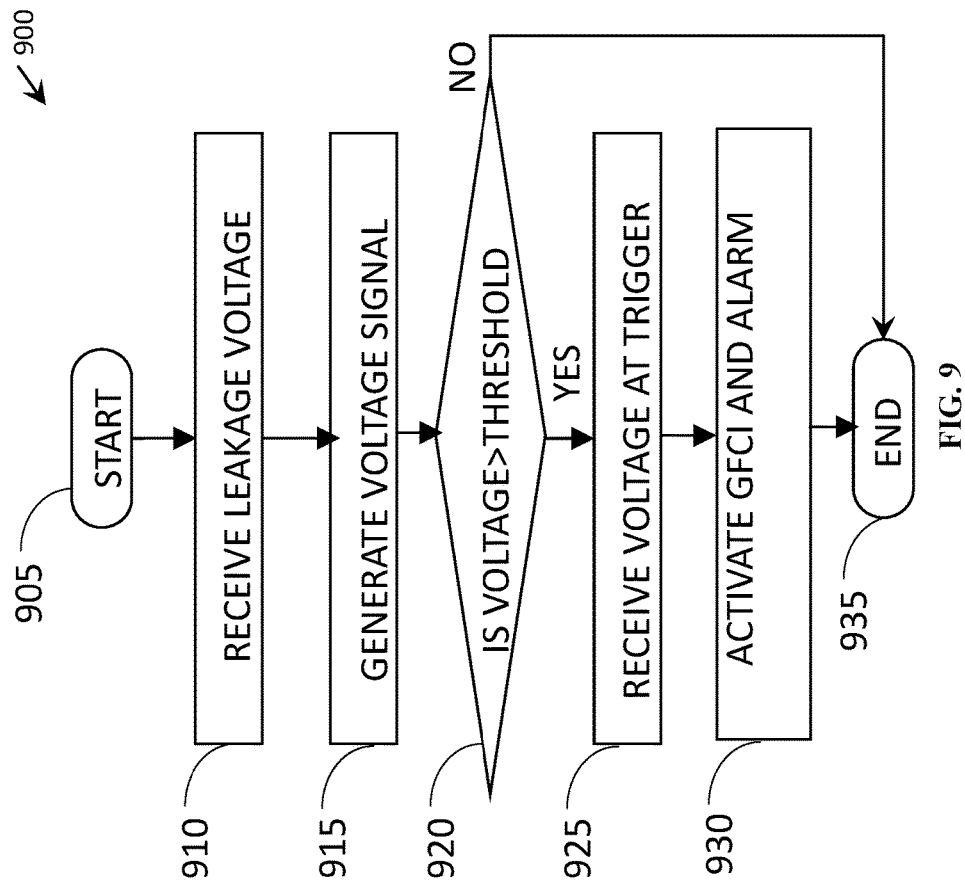
FIG. 9 is flow chart of a method of detecting/eradicating a leakage and/or stray voltage from a body of water, according to an embodiment of the present invention.

FIG. 9 is flow chart of a method 900 of eradicating a leakage voltage from a water body. The method 900 is implemented in a leakage voltage monitoring device. The method 900 begins at step 905.

At step 910, the leakage voltage monitoring device receives a leakage voltage in the water body. The leakage voltage monitoring device receives the leakage voltage in the water body via the wire sensor probes. The wire sensor probes are immersed in the water body. In the leakage voltage monitoring device, the leakage voltage is received at a voltage sensing circuit. Examples of the voltage sensing circuits include, but is not limited to an IC based current sensing circuit, a Bipolar Junction Transistor based current sensing circuit, and a MOSFET based current sensing circuit.

At step 915, the voltage sensing circuit generates a first voltage signal V1 from the leakage voltage. In one example, the voltage sensing circuit, after receiving the leakage voltage, passes the leakage voltage through at least one resistor and thereby generates a second voltage signal V2 across at least one resistor.

At step 920, the voltage sensing circuit compares the first voltage signal with a predefined threshold value. If the first voltage is greater than the predefined threshold value, the method 920 proceeds to step 925, otherwise the method 920 proceeds to step 935. Further, the voltage sensing circuit generates the first voltage signal V1 if magnitude of the second voltage signal V2 is greater than a predefined threshold voltage. In one example, the predefined threshold voltage is a zener breakdown voltage. The voltage sensing circuit transmits the first voltage signal V1 to a trigger circuit.

At step 925, the trigger circuit receives the first voltage V1. The trigger circuit is operable to activate a timer circuit and a Ground Fault Circuit Interrupter (GFCI) system. The timer circuit sends a voltage pulse V3 to the alarm circuit at regular, predefined time intervals and thereby activates the alarm circuit at regular predefined time interval. In one example, the timer circuit activates the alarm circuit every six seconds.

At step 930 the trigger circuit activates the alarm circuit and the GFCI system. The GFCI system is at least one of a circuit breaker type GFCI and a receptacle type GFCI. As mentioned above, the GFCI system is connected to the leakage current monitoring device. In one example, the leakage current monitoring system is connected to a neutral terminal of the GFCI system. To activate the GFCI system, the leakage current device sends a voltage to the neutral terminal of the GFCI system. The GFCI system, is operable to disconnect the electrical device from the high voltage power supply, in response to activation.

Further, the leakage voltage monitoring device is connected to the alarm circuit. The alarm circuit controls at least one of a siren, a light, and a speaker. The alarm circuit is activated by the timer circuit in the leakage voltage monitoring device. The alarm circuit, in response to activation, gives out a human perceptible indication to alert human beings about presence of the leakage voltage in the water body.

The method 900 ends at step 935.

The foregoing description comprises illustrative embodiments of the present invention. Having thus described exemplary embodiments of the present invention, it should be noted by those skilled in the art that the within disclosures are exemplary only, and that various other alternatives, adaptations, and modifications may be made within the scope of the present invention. Merely listing or numbering the steps of a method in a certain order does not constitute any limitation on the order of the steps of that method. Many modifications and other embodiments of the invention will come to mind to one skilled in the art to which this invention pertains having the benefit of the teachings presented in the foregoing descriptions. Although specific terms may be employed herein, they are used only in generic and descriptive sense and not for purposes of limitation. Accordingly, the present invention is not limited to the specific embodiments illustrated herein.

What is claimed is:

1. A device for eradicating a leakage voltage from a water body, the device comprising:
    at least one wire sensor probe to receive the leakage voltage in the water body, wherein the leakage voltage emanates from at least one voltage source immersed in the water body;
    a voltage sensing circuit operable to receive the leakage voltage to generate a voltage signal based on the leakage voltage;
    and a trigger circuit to receive the voltage signal, based on magnitude of the voltage signal being greater than a predefined threshold value, the trigger circuit operable to activate an alarm circuit, and activate a circuit breaker, wherein the circuit breaker, in response to activation of the circuit breaker, disconnects a power supply from the at least one voltage source immersed in the water body, thereby eradicating the leakage voltage from the water body, and wherein, if the leakage voltage is not eradicated from the water body then the alarm circuit, in response to activation of the alarm circuit, alerts a human being about presence of the leakage voltage in the water body;
    wherein the wire sensor probe is a 14 gauge solid copper wire insulated wire terminated with at least six (6) inches of silver solder.

2. The device of claim 1, wherein the alarm circuit is connected to at least one of a siren, a light, and a speaker.

3. The device of claim 1, wherein the circuit breaker is at least one of a circuit breaker type Ground Fault Circuit Interrupter (GFCI) and a receptacle type GFCI.

4. The device of claim 1, wherein the voltage sensing circuit is at least one of a transistor based voltage sensing circuit, an operational amplifier based voltage sensing circuit, and a resistor based voltage sensing circuit.

5. The device of claim 1, wherein the trigger circuit is at least one of a Bipolar Junction Transistor (BJT) based trigger circuit and an operational amplifier (Opamp) based trigger circuit.

6. The device of claim 1, wherein the at least one voltage source is at least one of an underwater light, an immersed water, an underwater scooter, and an electric boat engine.

7. A method of eradicating a leakage voltage from a water body, the method comprising:
 receiving with a wire sensor probe, at a voltage sensing circuit, the leakage voltage in the water body, wherein the leakage voltage emanates from at least one voltage source immersed in the water body;
 generating a voltage signal by the voltage sensing circuit;
 receiving the voltage signal by a trigger circuit, based on magnitude of the voltage signal being greater than a predefined threshold value;
 activating an alarm circuit by the trigger circuit, wherein the alarm circuit, in response to activation, alerts a human being about presence of the leakage voltage in the water body;
 and activating a circuit breaker by the trigger circuit, wherein the circuit breaker, in response to activation, disconnects a power supply from the at least one voltage source immersed in the water body, thereby eradicating the leakage voltage in the water body from the at least one voltage source;
 wherein the wire sensor probe is a 14 gauge solid copper wire insulated wire terminated with at least six (6) inches of silver solder.

8. The method of claim 7, wherein the alarm circuit is connected to at least one of a siren, a light, and a speaker.

9. The method of claim 7, wherein the circuit breaker is at least one of a circuit breaker type Ground Fault Circuit Interrupter (GFCI) and a receptacle type GFCI.

10. The method of claim 7, wherein the voltage sensing circuit is at least one of a transistor based voltage sensing circuit, an operational amplifier based voltage sensing circuit, and a resistor based voltage sensing circuit.

11. The method of claim 7, wherein the trigger circuit is at least one of a Bipolar Junction Transistor (BJT) based trigger circuit and an operational amplifier (Opamp) based trigger circuit.

12. The method of claim 7, wherein the at least one voltage source is at least one of an underwater light, an immersed water, an underwater scooter, and an electric boat propeller.

13. The method of claim 7, wherein the alarm circuit generates a human perceptible indication to alert human beings of presence of the leakage voltage.

* * * * *